United States Patent [19]

Takahashi et al.

[11] Patent Number: 5,280,236
[45] Date of Patent: Jan. 18, 1994

[54] IC TEST INSTRUMENT

[75] Inventors: Osamu Takahashi; Kazuo Yoshida, both of Sendai, Japan

[73] Assignee: Seiko Electronic Components Ltd., Japan

[21] Appl. No.: 824,012

[22] Filed: Jan. 22, 1992

[30] Foreign Application Priority Data

Jul. 23, 1991 [JP] Japan .................................. 3-57534

[51] Int. Cl.⁵ .............................................. G01R 1/067
[52] U.S. Cl. .................................. 324/158 P; 324/72.5
[58] Field of Search .............. 324/158; P, 72.5, 158 F; 200/264, 266, 200/269

[56] References Cited

U.S. PATENT DOCUMENTS

| | | | |
|---|---|---|---|
| 3,818,163 | 6/1974 | Robinson | 200/264 |
| 4,067,379 | 1/1978 | Hassler et al. | 200/264 |
| 4,777,335 | 10/1988 | Okutomi et al. | 200/266 |
| 4,891,480 | 1/1990 | Holden, Jr. et al. | 200/269 |
| 4,983,908 | 1/1991 | Tada et al. | 324/158 P |
| 5,084,672 | 1/1992 | Ikeuchi et al. | 324/158 P |

Primary Examiner—Ernest F. Karlsen
Attorney, Agent, or Firm—Bruce I. Adams; Van C. Wilks

[57] ABSTRACT

An IC test instrument has an IC test circuit for an integrated semiconductor chip. A probe card is coupled to the IC test circuit. Probe needles are disposed on the probe card. The probe needles comprise a cobalt-based alloy containing at least 10 weight-percent of chromium. A passive-state film comprised of chromium oxide is formed on one end of the probe needles, and a solder-enhancing metallic layer is formed on the other end of the probe needles. The passive-state film may be formed by electrolytic polishing or chemical solution immersion. The passive-state film prevents a contaminating substance, such as aluminum oxide, from adhering to the needle. The probe needle substrate may be bent and may be formed by wiredrawing a cobalt-based alloy.

7 Claims, 1 Drawing Sheet

IC TEST INSTRUMENT

BACKGROUND OF THE INVENTION

The present invention relates to an IC test instrument which is suitable for use, for example, in probe-testing semiconductor chips.

Probe needles for probe-testing are generally made of tungsten.

In a probe test of semiconductor chips, the tungsten probe needle incorporated in a probe card undergoes an enormous number of repetitive contacts, through the needle point, with semiconductor chips. The service life of the tungsten probe needle is about one million operations. As the probe needle tip repetitively comes in contact with aluminum pads formed on the semiconductor chip, aluminum oxide sticks to the end of the probe needle, increasing the contact resistance. The adhesion of aluminum oxide is caused as follows. In the process of manufacturing the tungsten probe needle, a tungsten oxide film is formed in the surface of the tungsten. But since the strength of the tungsten oxide film is weak, the tungsten oxide film is broken by the repeated contact with the aluminum pads, allowing the pure tungsten to come into direct contact with the aluminum pads. As a result, aluminum adheres to the tungsten and oxidizes.

Since the probe test cannot be continued when the contact resistance of the probe needle becomes large, it is necessary to polish the tip of the probe needle every several tens of thousands of contacts to remove the aluminum oxide. This requirement is a hindrance to the performance of automatic, continuous probe testing on a large number of semiconductor chips.

SUMMARY OF THE INVENTION

Accordingly, an object of the present invention is to provide a probe needle which has excellent wear resistance and elasticity.

A more particular object of the invention is to provide a probe needle having a tip on which aluminum oxide does not adhered easily, and which has stable contact resistance. The probe needle of the invention is made of a cobalt-based alloy containing at least 10 weight-percents of chromium, which has relatively high hardness and excellent wear resistance and elasticity. The reason why the chromium content is set to more than 10 weight-percents is that a passive-state film made mainly of chromium oxide can be easily formed. This formation of a passive-state film will be described later. The chromium alloy is drawn into a wire, whose one end to be brought into contact with the semiconductor chip is tapered by a common method such as a centerless grinding. The wire is then either subjected to an electrolytic polishing or immersed in a chemical solution to form a stable passive-state film mainly of chromium oxide. Without performing the centerless grinding, it is also possible to perform the electrolytic polishing or immersion in chemical solution after one end of the probe is tapered, in order to form the passive-state film mainly of chromium oxide over the surface.

The other end of the probe needle that is to be soldered to a probe printed circuit card is plated with a metal to improve solderability.

The material, after being formed into a wire, may be plated with a metal which has a good solderability, thereafter the plated metal layer is removed, then the wire is tapered and formed with a passive-state film mainly of chromium oxide.

The passive-state hard chromium oxide film formed over the tip of the probe to be brought into contact with semiconductor chips is effective to prevent adhesion of aluminum.

BRIEF DESCRIPTION OF THE DRAWINGS

For a more complete understanding of the invention reference be made to the drawings, in which.

DESCRIPTION OF PREFERRED EMBODIMENT

TABLE 1

| Material | Component (wt %) | | | | | | | | | |
| --- | --- | --- | --- | --- | --- | --- | --- | --- | --- | --- |
| | Co | Cr | Ni | Fe | W | Mo | Nb | Ti | Si | Mn |
| Material A | 35 | 21 | 30.4 | 2.1 | — | 10 | 1.5 | 0.8 | — | 0.5 |
| Material B | 38 | 12 | 16.5 | 22.7 | 4 | 4 | — | 1 | 0.8 | 1 |

The material A and material B of cobalt-base alloys, whose components are shown in Table 1, are drawn into wire 0.25 mm in diameter by an ordinary wire-drawing technique. Then, they are plated over the surface with nickel to a thickness of 2 to 3 $\mu$m. The metal used for plating is not limited to nickel as long as it has a good solderability. The plating thickness is also not limited to 2 to 3 $\mu$m. The plated wires are then cut to pieces of 25 mm. One end of each piece is tapered by centerless grinding. The tapered portion is immersed either in a chromic acid aqueous solution to perform electrolytic polishing or in a nitric acid aqueous solution to form a passive-state film of chromium oxide over the surface to a thickness of the order of angstroms.

A passive-state film can be formed by high-temperature oxidation, but this method increases the thickness of the passive-state film. Therefore the contact resistance is too high and not suitable to the use of the probe needle.

Figure 1:
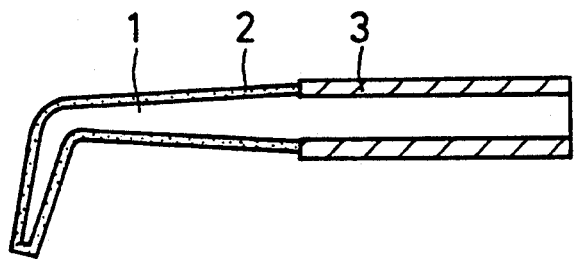
FIG. 1 is a longitudinal cross section of the probe needle.

FIG. 1 shows a longitudinal cross section of the probe needle of this invention. Reference numeral 1 designates a cobalt-based alloy that forms a major part of the probe needle. A passive-state film 2 is formed over the tip of the needle. A metal-plated layer 3 is provided to improve solderability.

The tip of the needle is bent as shown in FIG. 1 and subjected to an aging treatment in a vacuum to provide wear resistance and elasticity, the aging temperature may be selected in a range of 0° to 500° C. according to the mechanical strength required.

The mechanical strength obtained after two hours of aging at 500° C. is, for the material A, the Vickers hardness of Hv 620 and the tensile strength of 240 kg/mm$^2$ and, for the material B, the Vickers hardness of Hv 710 and the tensile strength of 280 kg/mm$^2$.

Figure 2:
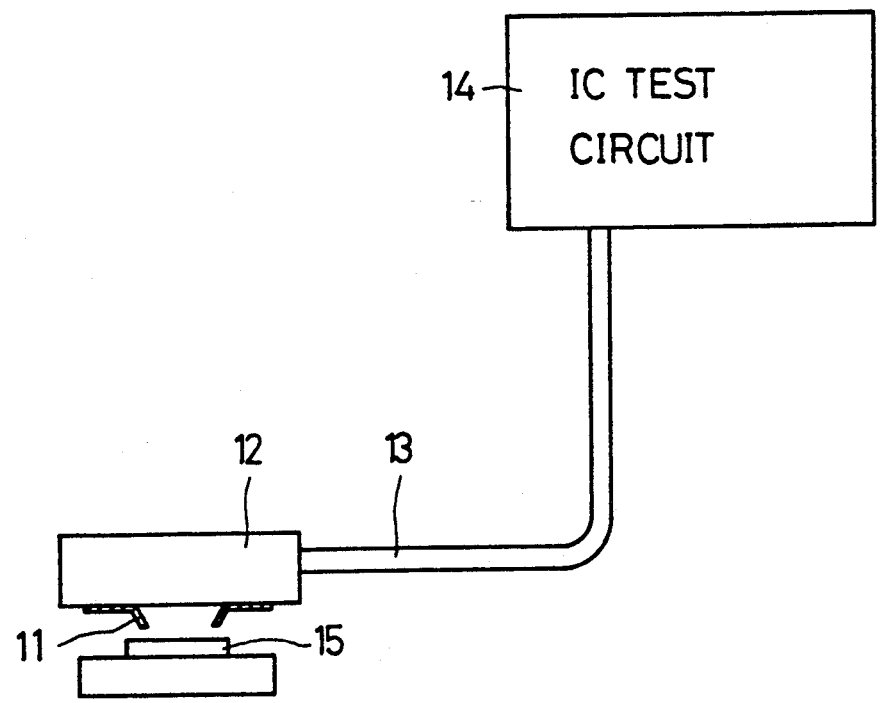
FIG. 2 is a diagram of the IC test instrument.

FIG. 2 shows a diagram of the IC test instrument.

The probe needle 11 thus formed is incorporated into the probe card 12. The probe card 12 is coupled to the IC test circuit 14 with a coaxial cable 13. The tip of the needle 11 is pushed into the aluminum pad of the semiconductor chip 15 with needle pressure of 50 $\mu$m. "Pressure of 50 $\mu$m" means here that the length of scar formed on the aluminum pad by the needle pressure is 50 $\mu$m.

A probe test at pressure of 50 μm showed that both the material A and material B exhibited stable contact resistances after up to one million operations. There was no need to polish the probe tip during the probe test. No aluminum oxide adhesion to the probe needle tip was found after one million contacting operation.

TABLE 2

| Material | Number of contacting operations (Ω) | | | |
| --- | --- | --- | --- | --- |
| | Initial state | 300,000 operations | 500,000 operations | 1,000,000 operations |
| Material A | 0.55 | 0.56 | 0.56 | 0.58 |
| Material B | 0.77 | 0.77 | 0.78 | 0.79 |

Table 2 shows the contact resistances (Ω) at specified numbers of contacting operations during the probe test with needle pressure of 50 μm.

As mentioned above, since the probe needle of this invention has excellent wear resistance and elasticity and its tip is prevented from being stuck with aluminum oxide, the probe testing can be continued without polishing the tip of the probe needle.

What we claim is:

1. An IC test instrument, comprising: an IC test circuit for an integrated semiconductor chip; a probe card coupled to the IC test circuit; and probe needles disposed on the probe card, the probe needles comprising a cobalt-based alloy containing at least 10 weight-percent of chromium, a passive-state film comprised mainly of chromium oxide formed on one end of the probe needles, and a solder-enhancing metallic layer formed on the other end of the probe needles.

2. An IC test instrument according to claim 1; wherein the passive-state film is formed by at least one of an electrolytic polishing and chemical solution immersion.

3. A probe needle comprising: a cobalt-based alloy containing at least 10 weight-percent of chromium, a passive-state film comprised mainly of chromium oxide formed on one end of the probe needle, and a solder-enhancing metallic layer formed on the other end of the probe needle.

4. A probe needle according to claim 3, wherein the passive-state film is formed by at least one of an electrolytic polishing and chemical solution immersion.

5. A probe needle according to claim 3, wherein the passive-state film comprises an electrolytically polished film.

6. A probe needle according to claim 3, wherein the passive-state film is formed by immersion in a solution.

7. A probe needle according to claim 3, wherein the probe needle has a bent shape.

* * * * *